United States Patent
Lin et al.

(10) Patent No.: US 8,207,043 B2
(45) Date of Patent: Jun. 26, 2012

(54) METHOD FOR FABRICATING A SEMICONDUCTOR DEVICE

(75) Inventors: Huang-Yi Lin, Tainan (TW); Jiun-Hung Shen, Taipei County (TW); Chi-Horn Pai, Taipei (TW); Yi-Chung Sheng, Tainan (TW); Shih-Chieh Hsu, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 92 days.

(21) Appl. No.: 12/568,657

(22) Filed: Sep. 28, 2009

(65) Prior Publication Data
US 2011/0076823 A1    Mar. 31, 2011

(51) Int. Cl.
*H01L 21/336* (2006.01)
(52) U.S. Cl. .......... 438/308; 438/663; 438/299
(58) Field of Classification Search .......... 257/E21.548, 257/288, 510, 374, 301, 347, 19, 192, 48; 438/427, 296, 199, 401, 211, 424, 221, 428, 438/750, 258, 425, 285, 219, 152, 154, 238, 438/141, 299
See application file for complete search history.

(56) References Cited

U.S. PATENT DOCUMENTS

| | | | |
|---|---|---|---|
| 5,399,506 A | 3/1995 | Tsukamoto | |
| 5,966,605 A | 10/1999 | Ishida | |
| 6,100,171 A | 8/2000 | Ishida | |
| 6,365,476 B1 | 4/2002 | Talwar | |
| 6,642,122 B1 | 11/2003 | Yu | |
| 7,473,606 B2 | 1/2009 | Hsiao | |
| 7,592,270 B2* | 9/2009 | Teo et al. | 438/778 |
| 7,618,857 B2* | 11/2009 | Leong et al. | 438/224 |
| 2005/0054164 A1* | 3/2005 | Xiang | 438/285 |
| 2007/0232079 A1 | 10/2007 | Chidambaram | |
| 2007/0290192 A1* | 12/2007 | Rotondaro | 257/19 |
| 2008/0026599 A1 | 1/2008 | Spencer et al. | |
| 2008/0230841 A1* | 9/2008 | Quek et al. | 257/369 |
| 2009/0221117 A1* | 9/2009 | Tan et al. | 438/238 |
| 2010/0210084 A1* | 8/2010 | Yang et al. | 438/285 |

OTHER PUBLICATIONS

L. Mariucci et al., "Mechanisms of dopant redistribution and retention in Silicon following ultra-low energy Boron implantation and excimer laser annealing", ESSDERC 2002, p. 595-598.

* cited by examiner

*Primary Examiner* — Kevin M Picardat
*Assistant Examiner* — Neil Prasad
(74) *Attorney, Agent, or Firm* — Winston Hsu; Scott Margo

(57) ABSTRACT

A method for making a semiconductor MOS device is provided. A gate structure is formed on a substrate. A source and a drain are formed in the substrate on both sides of the gate structure. The substrate is then subjected to a pre-amorphization implant (PAI) process. A transitional stress layer is then formed on the substrate. Thereafter, a laser anneal with a first temperature is performed. After the laser anneal, a rapid thermal process is performed with a second temperature that is lower than the first temperature. Subsequently, the transitional stress layer is removed.

20 Claims, 10 Drawing Sheets

METHOD FOR FABRICATING A SEMICONDUCTOR DEVICE

BACKGROUND OF THE INVENTION

1. Field of the Invention

The present invention relates generally to the semiconductor technology, and more particularly, to a method for fabricating a high-performance metal-oxide-semiconductor (MOS) transistor device.

2. Description of the Prior Art

A conventional MOS transistor generally includes a semiconductor substrate, a source region, a drain region, a channel between the source region and the drain region, and a gate located above the channel. The gate typically comprises a gate dielectric layer and a gate conductive layer positioned on the gate dielectric layer. Generally, for a given electric field across the channel of a MOS transistor, the amount of current that flows through the channel is directly proportional to a mobility of the carriers in the channel. Therefore, how to improve the carrier mobility so as to increase the speed and performance of MOS transistors has become a major topic for study in the semiconductor field.

It is known in the art to produce a mechanical stress or strain in the channel in order to increase the carrier mobility in the channel of an MOS transistor. For example, a compressive strained channel, such as a silicon germanium (SiGe) channel layer may be grown on silicon, which can significantly enhance hole mobility. A tensile strained channel, such as a thin silicon channel layer may be grown on silicon germanium to achieves electron mobility enhancement. Another prior art method of obtaining a strained channel is to epitaxially grow a SiGe layer adjacent to the spacers within the semiconductor substrate after forming the spacer. In this type of MOS transistor, a biaxial tensile strain occurs in the epitaxial silicon layer due to the silicon germanium, which has a larger lattice constant than that of silicon, and, as a result, the band structure alters, and the carrier mobility increases.

Another approach to the introduction of stress is the stress memorization technique (SMT), which has been employed in 65 nm semiconductor manufacturing processes for enhancing device performance. The SMT generally includes selectively depositing a stressed nitride layer on the gate electrode as a stressor after pre-amorphization implant. The stressed nitride layer is removed after the thermal activation procedures. The stress modulation effect is enhanced and memorized to affect the channel stress underneath the re-crystallized gate electrode after removal of the nitride layer.

However, the above-mentioned prior art has several drawbacks. For example, after the introduction of the stress either by way of the SiGe strained silicon channel technique or by way of SMT stress introduction process, silicon dislocation defects are observed in the silicon substrate, which adversely affects the yield of the manufacturing process.

SUMMARY OF THE INVENTION

It is one objective of the present invention to provide an improved method for fabricating the MOS transistor device in order to overcome the shortcomings and drawbacks of the prior art.

To these ends, according to one aspect of the present invention, there is provided a method for fabricating a semiconductor device including providing a semiconductor substrate; forming a gate structure on the semiconductor substrate; forming a source region and a drain region in the semiconductor substrate on two sides of the gate structure; performing a pre-amorphization ion implantation process to pre-amorphizing a surface of the source region and the drain region; forming a transitional stress layer on the semiconductor substrate; subjecting the semiconductor substrate to a laser anneal process with a first temperature; after the laser anneal process, subjecting the semiconductor substrate to a rapid thermal process (RTP) with a second temperature, wherein the first temperature is greater than the second temperature; and removing the transitional stress layer.

In one aspect, there is provided a method for fabricating a semiconductor substrate including providing a semiconductor substrate; forming a gate structure on the semiconductor substrate; forming a source region and a drain region in the semiconductor substrate on two sides of the gate structure; performing a pre-amorphization ion implantation process to pre-amorphizing the source region and the drain region; forming a transitional stress layer on the semiconductor substrate; after forming the transitional stress layer, subjecting the semiconductor substrate to a laser anneal process with a first temperature; after the laser anneal process, removing the transitional stress layer; and after removing the transitional stress layer, subjecting the semiconductor substrate to a rapid thermal process (RTP) with a second temperature, wherein the first temperature is greater than the second temperature.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
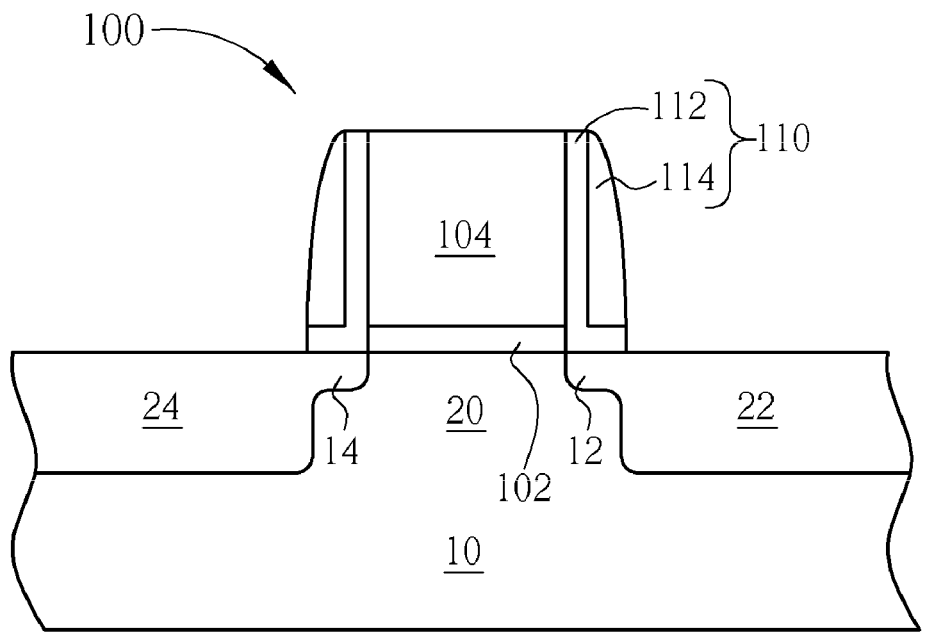
FIG. 1 to FIG. 7 are schematic, cross-sectional diagrams showing a method for fabricating a MOS transistor device in accordance with one preferred embodiment of this invention.

In describing the preferred embodiments of the present invention, reference will be made herein to FIGS. 1-19 of the drawings. Features of the invention are not drawn to scale in the drawings. It is to be understood that some lithographic, ion implanting and etching processes relating to the present invention method are known in the art and thus not explicitly shown in the drawings.

Please refer to FIG. 1 to FIG. 7. FIG. 1 to FIG. 7 are schematic, cross-sectional diagrams showing an exemplary method for fabricating a metal-oxide-semiconductor (MOS) transistor device in accordance with one preferred embodiment of this invention. As shown in FIG. 1, a gate structure 100 is formed on a semiconductor substrate 10. The gate structure 100 includes a gate dielectric layer 102 and a gate conductive layer 104 disposed on the gate dielectric layer 102. The semiconductor substrate 10 may comprise silicon substrate or silicon-on-insulator (SOI) substrate, but not limited thereto. The gate dielectric layer 102 may comprise insulating materials such as silicon oxide, silicon oxy-nitride, metal nitride, composite dielectric materials with high dielectric constant or the like. The gate conductive layer 104 may comprise conductive materials such as polycrystalline silicon, silicide, metals or alloys with suitable work function. The gate structure 100 further comprises spacers 110 that are disposed on respective sidewalls of the gate conductive layer 104. According to the preferred embodiment, each of the spacers 110 may further comprise a liner layer 112 such as silicon dioxide layer, and a silicon nitride spacer layer 114. Optionally, the gate structure 100 may comprise a cap layer (not shown) on the gate conductive layer 104.

A lightly doped drain (LDD) region 12 and an LDD region 14 are formed in the semiconductor substrate 10 and are situated directly under the spacers 110 respectively. A channel region 20 is defined between the LDD region 12 and the LDD region 14. Typically, the LDD regions 12 and 14 are formed by ion implanting N type or P type dopants into the semiconductor substrate 10 using conventional LDD ion implantation process and the LDD ion implantation process is typically carried out after the formation of the liner layer 112. Optionally, a rapid thermal process (RTP) may be performed after the LDD ion implantation process. After the LDD ion implantation process, the silicon nitride spacer layer 114 is formed. Subsequently, a source/drain heavy implantation process is carried out to heavily dope the semiconductor substrate 10 at two sides of the gate structure 100, thereby forming drain region 22 and source region 24.

It is noteworthy that the sequence of the LDD ion implantation process and the source/drain heavy implantation process may be changed and may be implemented in combination with sacrificial spacers or spacers in addition to spacers 112 and 114. The shapes or profiles of the spacers are not limited to L-shape such as the liner layer 112 or sail-shape such as the spacer 114. Further, the LDD ion implantation process and the source/drain heavy implantation process may be carried out in several times. The anneal process for activating the dopants in the LDD or source/drain regions may carried out in one time or in several times, and may be interposed between any process steps.

Figure 2:
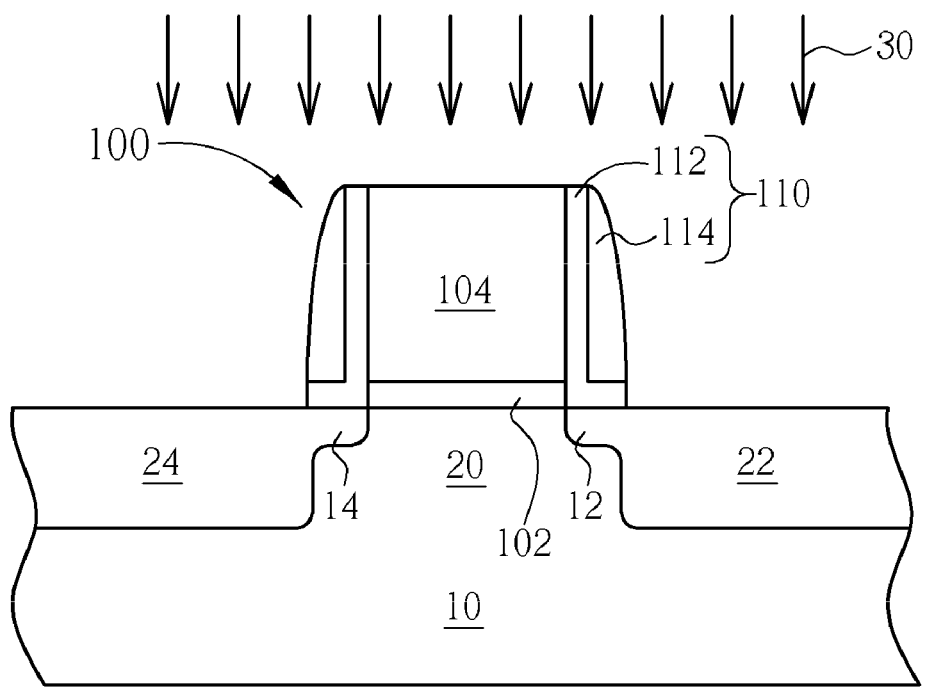

As shown in FIG. 2, according to the preferred embodiment of this invention, after the formation of the drain region 22 and the source region 24, the semiconductor substrate 10 is subjected to a pre-amorphization implant (PAI) process 30. The PAI process 30 is accomplished by implanting an amorphizing substance such as In, Ge or Sb with suitable energy and dosage into the semiconductor substrate 10 to form amorphized layer in the drain region 22 and in the source region 24. According to another embodiment of this invention, the PAI process 30 may be carried out before the formation of the drain region 22 and the source region 24.

Figure 3:
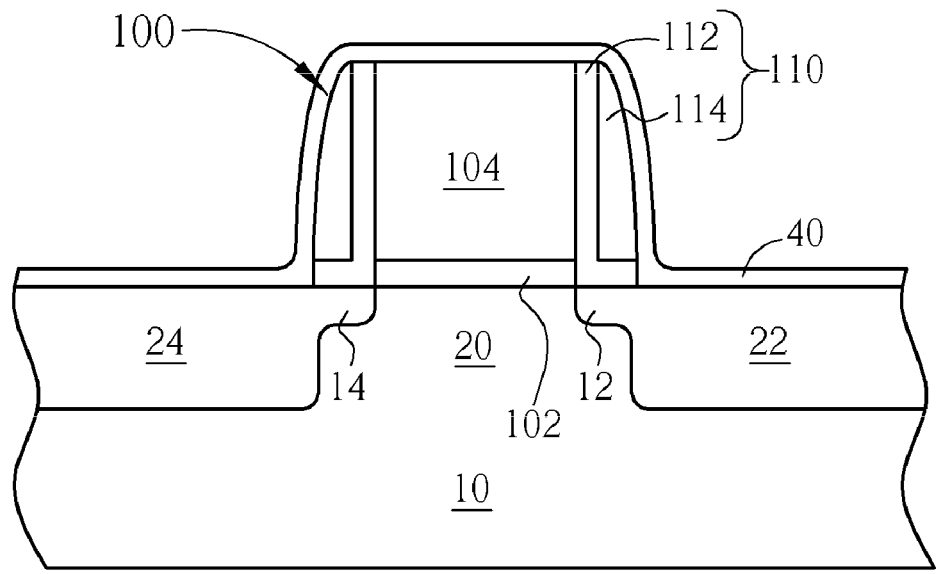

As shown in FIG. 3, subsequently, a chemical vapor deposition (CVD) process such as a plasma-enhanced CVD (PECVD) process is performed to conformally deposit a transitional stress layer 40 on the semiconductor substrate 10. According to this invention, the transitional stress layer 40 may comprise silicon nitride layer and may have a thickness between 100 angstroms and 400 angstroms. The transitional stress layer 40 conformally covers the drain region 22, the source region 24 and the gate structure 100.

According to the preferred embodiment of this invention, the transitional stress layer 40 has a pre-selected stress status, for example, tensile-stressed or compressive-stressed. Typically, in a case that the MOS transistor device is an NMOS device, the transitional stress layer 40 is tensile-stressed, while in a case that the MOS transistor device is a PMOS device, the transitional stress layer 40 is compressive-stressed. For example, the transitional stress layer 40 may be initially deposited in a tensile-stressed status with an as—deposition stress value ranging between 0.7 GPa and 0.9 GPa. Afterward, a surface treatment, such as a UV curing process, a thermal spike anneal process or an e-beam treatment, can be performed to the transitional stress layer 40 so as to alter the stress value. Alternatively, the initial deposition stress of the transitional stress layer 40 may be adjusted to the desired value by altering process parameters for forming the transitional stress layer 40.

Figure 4:
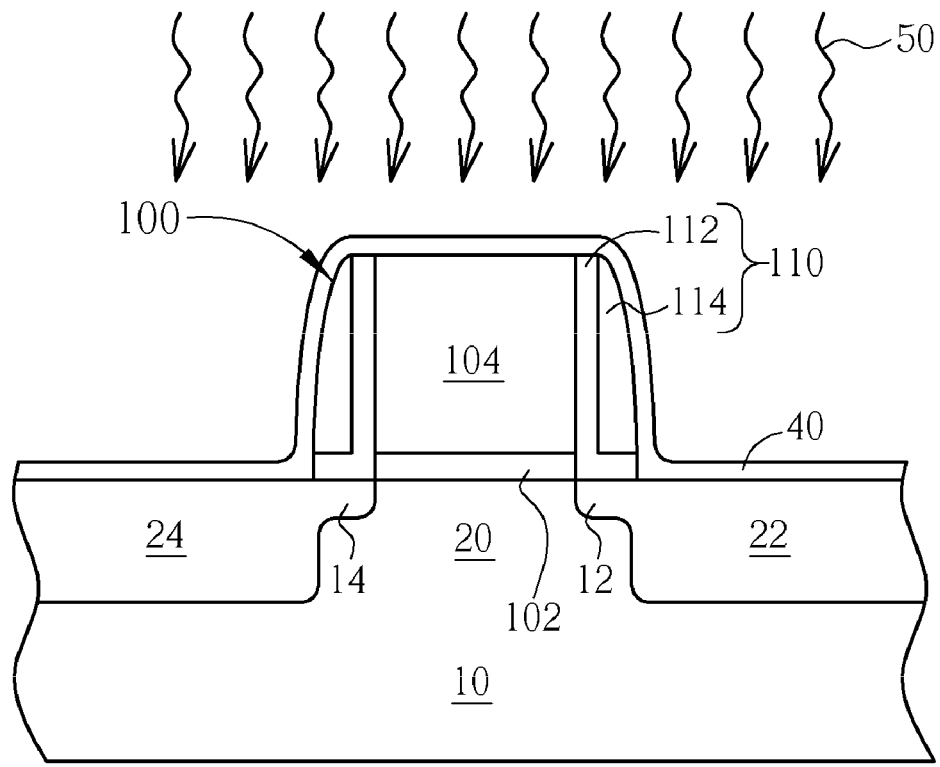

As shown in FIG. 4, after the deposition of the transitional stress layer 40, a laser anneal process 50 is then carried out. According to this invention, the laser anneal process 50 may be laser spike anneal (LSA) or laser thermal anneal (LTA), but not limited thereto. The laser anneal process 50 is accomplished by scanning laser beam with specific power and scanning speed across a wafer or a chip so that areas are locally heated, and thus annealed, as the laser beam passes. By implementing the laser anneal process 50, the semiconductor substrate 10 treated with PAI process can memorize the stress that the transitional tress layer 40 imparts thereto. According to the preferred embodiment of this invention, the laser anneal process 50 is carried out with a first temperature that ranges between 1100° C. and 1350° C., preferably 1300° C.

The aforesaid laser anneal process 50, which is also referred to as millisecond anneal technique, scans a narrow beam from a long-wavelength laser across the wafer surface to create a small, localized hot spot with a millisecond or shorter dwell time. Since only a thin layer at the top surface is heated and the bulk of the wafer remains cool, the surface temperature falls almost as fast as it rises. The high peak temperature produces high dopant activation, and the short dwell time leads to minimal dopant diffusion and lower thermal budget such that the ultra-shallow junction of the MOS device can be maintained, as required for the 65 nm technology node and beyond. The processed region can be localized to specific areas on the wafer without affecting surrounding areas.

Figure 5:
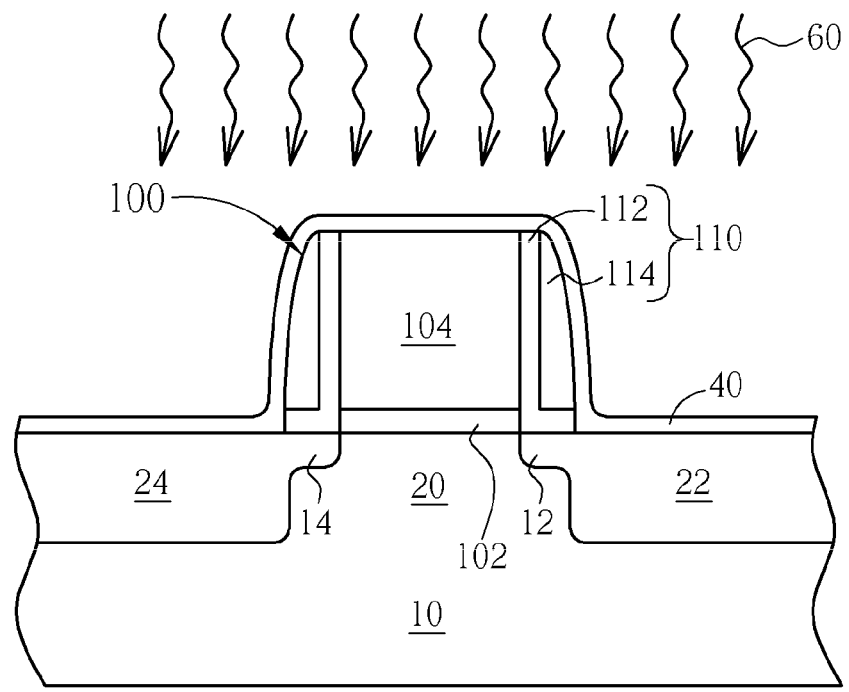

As shown in FIG. 5, after performing the laser anneal process 50, a rapid thermal process (RTP) 60 with a second temperature is subsequently carried out. The RTP 60 may be a spike RTP, for example. According to the preferred embodiment of this invention, the second temperature is greater than 1000° C. and is lower than the first temperature used in the laser anneal process 50. Preferably, the second temperature is about 1050° C. It is one main purpose of the RTP 60 to activate the dopants in the drain region 22 and the source region 24 and recrystallize the amorphized gate conductive layer 104 as well as the drain region 22 and source region 24. It is another main purpose of the RTP 60 to repair the silicon dislocation defects caused by the laser anneal process 50.

Figure 6:
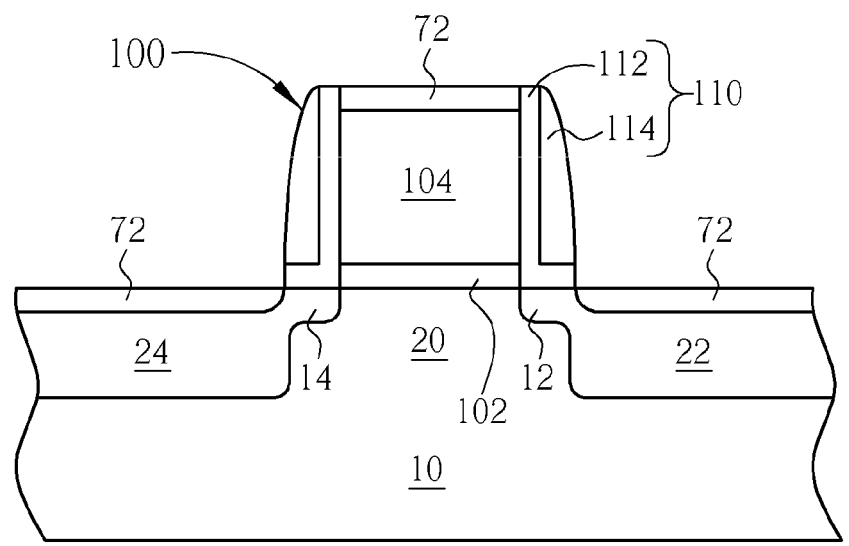

As shown in FIG. 6, after performing the RTP 60, the transitional stress layer 40 is completely removed. At this point, the semiconductor substrate 10 treated with laser anneal process 50 has memorized the stress originated from the transitional stress layer 40. Subsequently, a silicide or salicide process is performed to form silicide layers 72 such as nickel silicide or cobalt silicide on the drain region 22, the source region 24 and the gate structure 100. In one embodiment, the silicide layer 72 is not formed on the gate structure 100 because a cap layer (not shown) is provided on the gate conductor layer 104. It is noteworthy that the transitional stress layer 40 may be removed before the RTP 60 in other cases.

Figure 7:
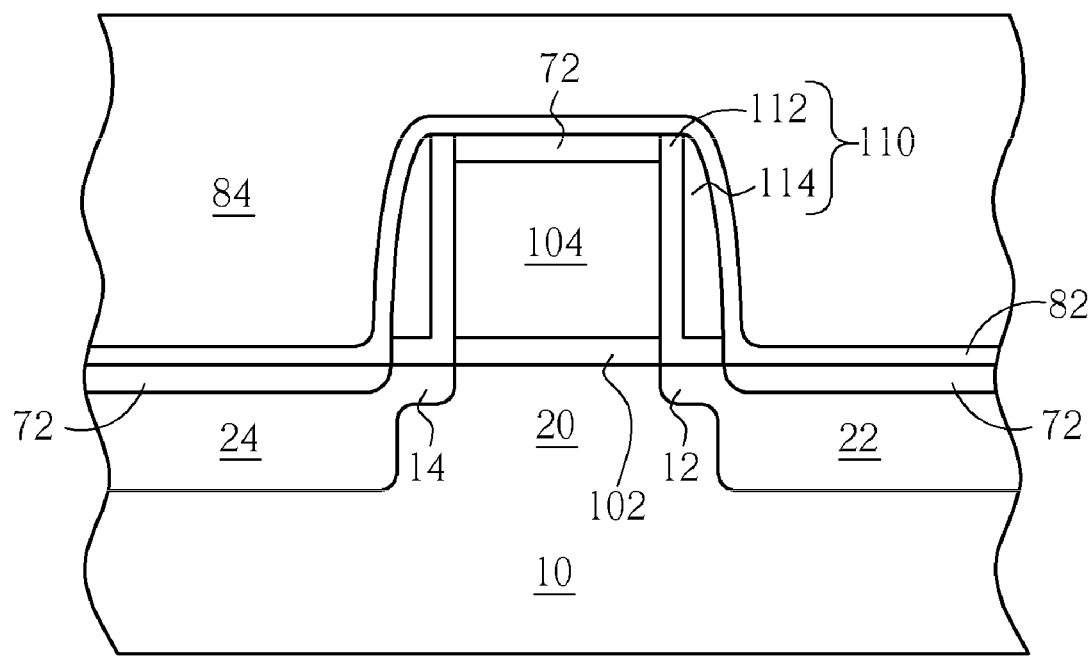

As shown in FIG. 7, after removing the transitional stress layer 40, a CVD process is carried out to deposit a conformal contact etch stop layer (CESL) 82 such as silicon nitride on the surface of the semiconductor substrate 10. The contact etch stop layer 82 may have a thickness ranging between 250 angstroms and 850 angstroms. The contact etch stop layer 82 covers the drain region 22, the source region 24 and the gate structure 100. According to the preferred embodiment, the contact etch stop layer 82 has a pre-selected stress status, for example, tensile-stressed or compressive-stressed. In a case that the MOS transistor device is an NMOS device, the contact etch stop layer 82 is tensile-stressed, while in a case that the MOS transistor device is an PMOS device, the contact etch stop layer 82 is compressive-stressed. Thereafter, a dielectric layer 84 is formed on the contact etch stop layer 82. The following metal interconnection process such as contact hole etching or copper damascene process are known in the art and are therefore not described herein.

Figure 8:
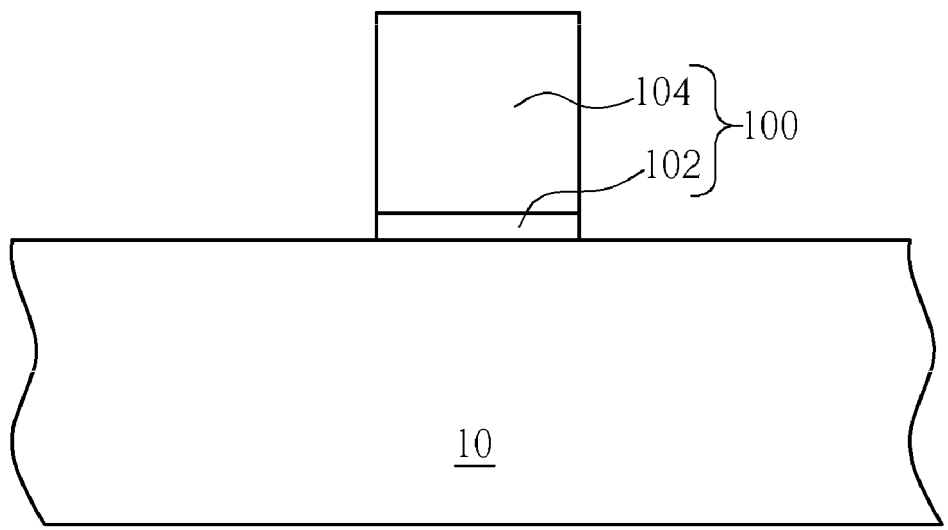
FIG. 8 to FIG. 19 are schematic, cross-sectional diagrams showing a method for fabricating a MOS transistor device in accordance with another preferred embodiment of this invention.

FIG. 8 to FIG. 19 are schematic, cross-sectional diagrams showing an exemplary method for fabricating a MOS transistor device in accordance with another preferred embodiment of this invention, wherein like numeral numbers designate like layers, elements or regions. As shown in FIG. 8, likewise, a gate structure 100 is formed on a semiconductor substrate 10. The gate structure 100 includes a gate dielectric layer 102 and a gate conductive layer 104 disposed on the gate dielectric layer 102. The semiconductor substrate 10 may comprise silicon substrate or silicon-on-insulator (SOI) substrate, but not limited thereto. The gate dielectric layer 102 may comprise insulating materials such as silicon oxide, silicon oxy-nitride, metal nitride, composite dielectric materials with high dielectric constant or the like. The gate conductive layer 104 may comprise conductive materials such as polycrystalline silicon, silicide, metals or alloys with suitable work function. In addition, a cap layer such as a silicon nitride layer may be formed on the gate conductive layer 104.

Figure 9:
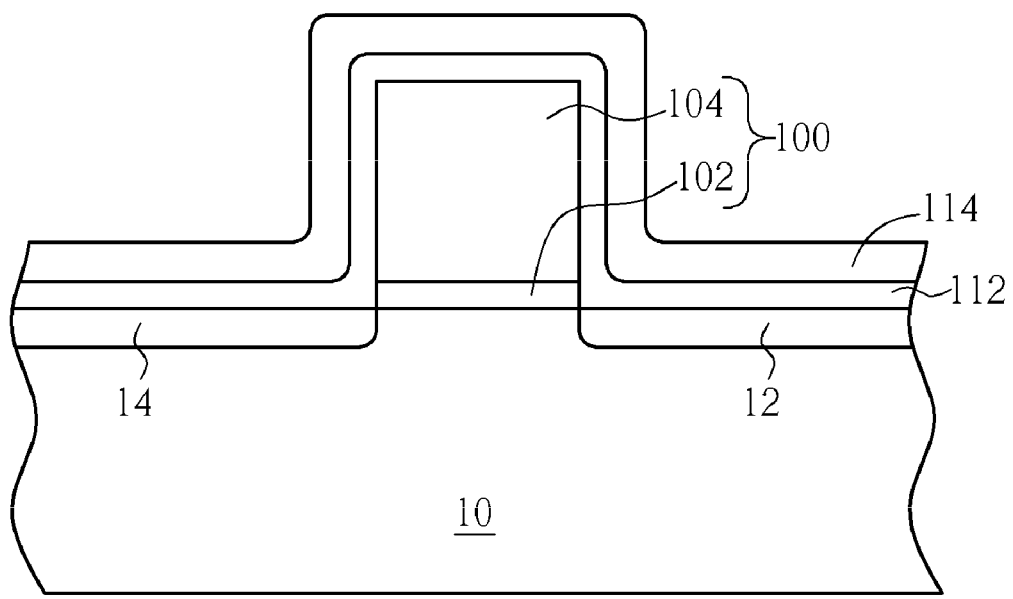

As shown in FIG. 9, a liner layer 112 such as a silicon dioxide layer is deposited on the semiconductor substrate 10. An LDD ion implantation process is then carried out to implant dopants into the semiconductor substrate 10, thereby forming the LDD region 12 and the LDD region 14. Subsequently, a conformal silicon nitride spacer layer 114 is deposited on the semiconductor substrate 10.

Figure 10:
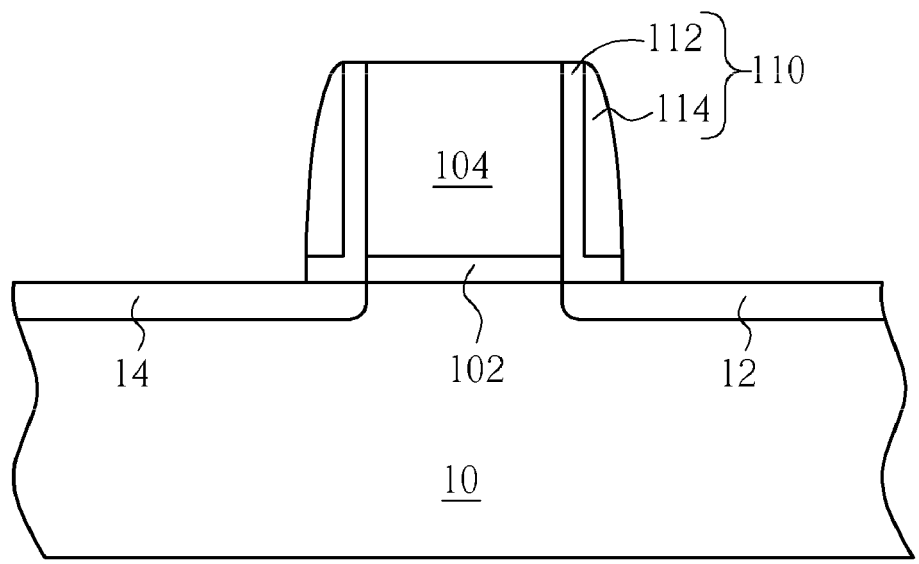

As shown in FIG. 10, an anisotropic dry etching process is performed to anisotropically etch the silicon nitride spacer layer 114 and the liner layer 112 to form the spacers 110 on respective sidewalls of the gate.

Figure 11:
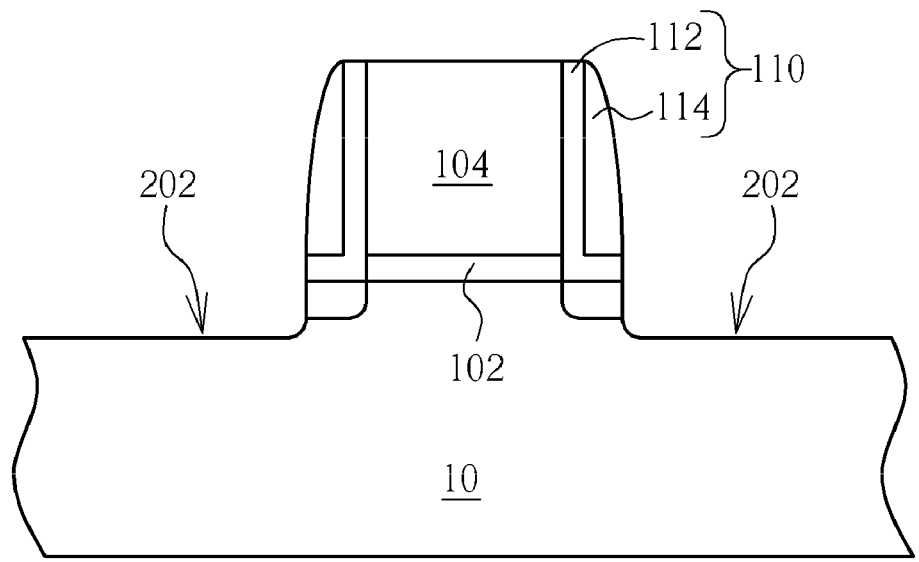

Subsequently, as shown in FIG. 11, a self-alignment dry etching or wet etching process is carried out to etch a recessed area 202 into the semiconductor substrate 10 next to the spacers 110 in a self-aligned manner. The depth of the recessed area 202 may range between 500 angstroms and 800 angstroms.

Figure 12:
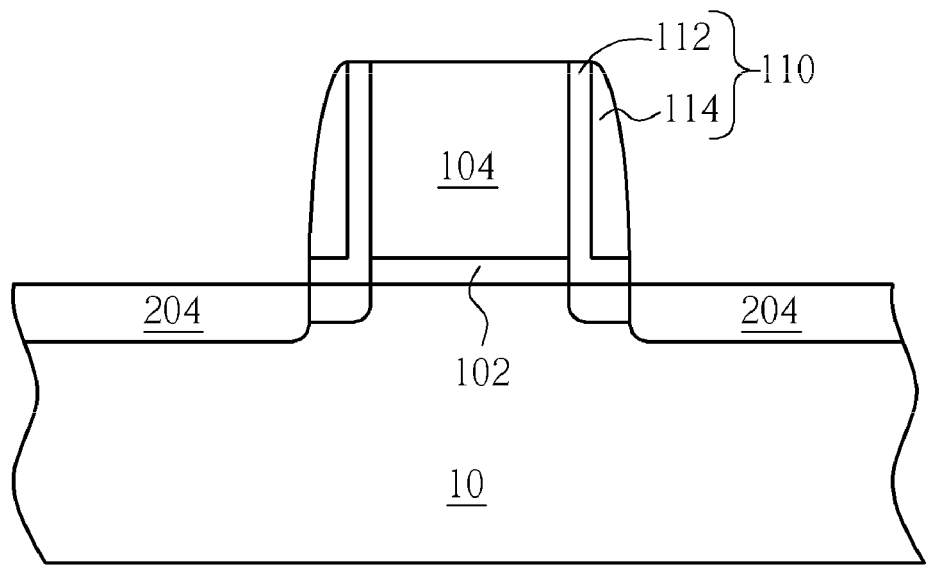

As shown in FIG. 12, after the formation of the recessed area 202, a selective epitaxial growth (SEG) process is carried out to fill the recessed area 202 with an epitaxial layer 204 such as SiGe or SiC epitaxial layer. The epitaxial layer 204 in FIG. 12 is for illustration purposes only. In effect, the epitaxial layer 204 may be composed of multiple layers of epitaxial materials having different doping concentrations and the top surface of the epitaxial layer 204 may be slightly higher than the main surface of the substrate 10.

Figure 13:
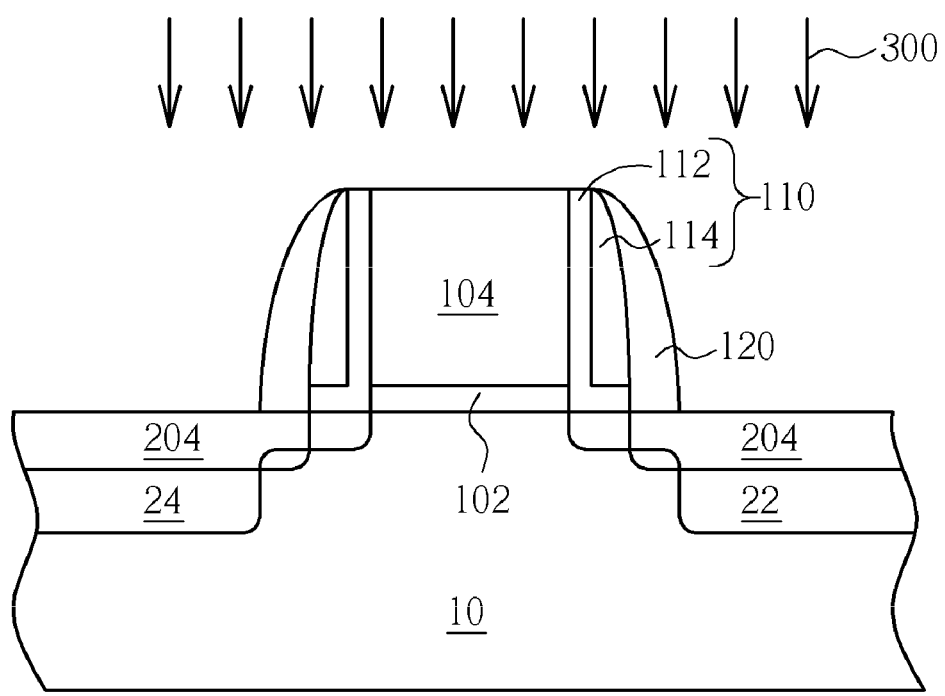

As shown in FIG. 13, a second spacer 120 is then formed on the spacer 110. Thereafter, a source/drain heavy implantation process 300 is carried out to heavily dope the semiconductor substrate 10 at two sides of the gate structure 100 next to the second spacer 120, thereby forming drain region 22 and source region 24.

It is noteworthy that the sequence of the LDD ion implantation process and the source/drain heavy implantation process may be changed and may be implemented in combination with sacrificial spacers or spacers in addition to spacers 112 and 114. The shapes or profiles of the spacers are not limited to L-shape such as the liner layer 112 or sail-shape such as the spacer 114. Further, the LDD ion implantation process and the source/drain heavy implantation process may be carried out in several times. The anneal process for activating the dopants in the LDD or source/drain regions may carried out in one time or in several times, and may be interposed between any process steps.

Figure 14:
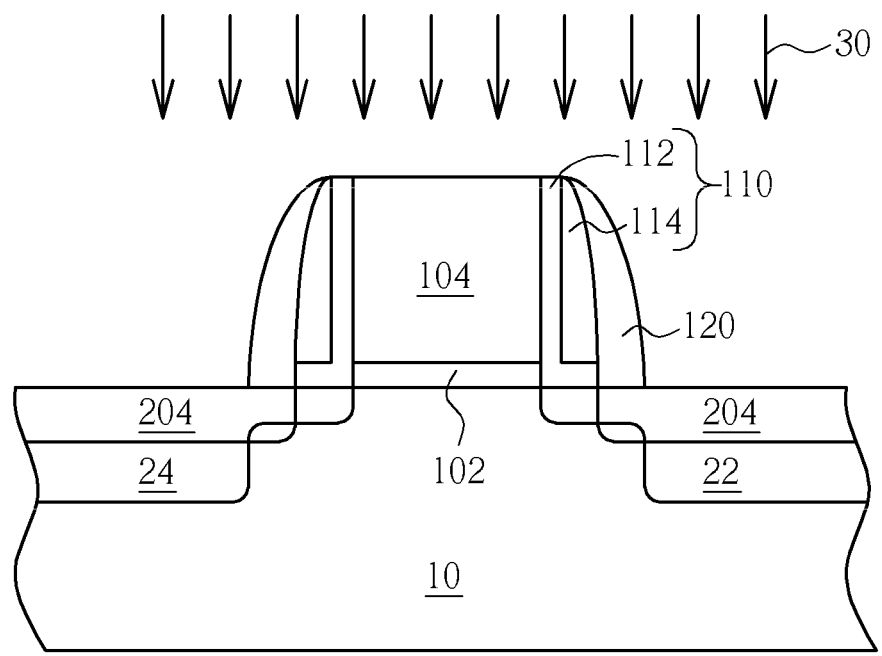

As shown in FIG. 14, according to the preferred embodiment of this invention, after the formation of the heavily doped drain region 22 and the source region 24, the semiconductor substrate 10 is subjected to a pre-amorphization implant (PAI) process 30. The PAI process 30 is accomplished by implanting an amorphizing substance such as In, Ge or Sb with suitable energy and dosage into the semiconductor substrate 10 to form amorphized layer in the drain region 22 and in the source region 24. According to another embodiment of this invention, the PAI process 30 may be carried out before the formation of the source/drain heavy implantation process 300.

Figure 15:
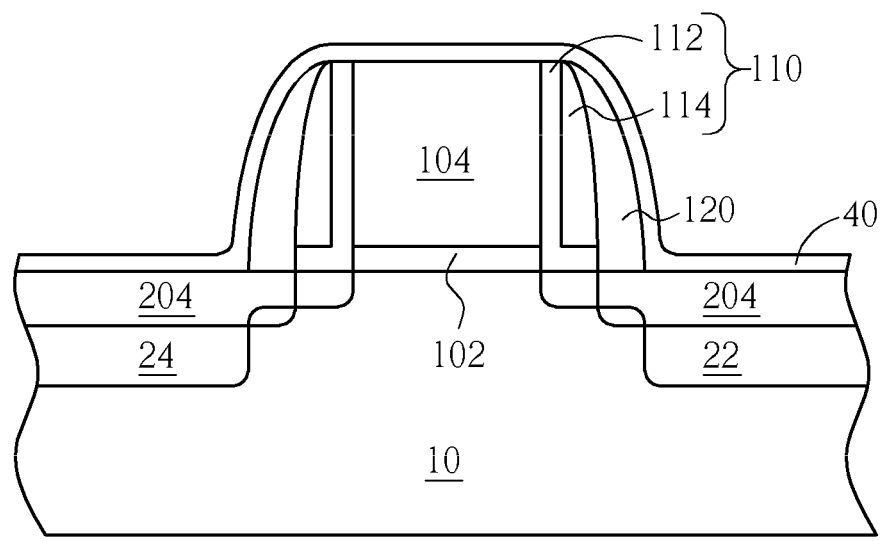

As shown in FIG. 15, subsequently, a chemical vapor deposition (CVD) process such as PECVD process is performed to conformally deposit a transitional stress layer 40 on the semiconductor substrate 10. According to this invention, the transitional stress layer 40 may comprise silicon nitride layer and may have a thickness between 100 angstroms and 400 angstroms. The transitional stress layer 40 conformally covers the drain region 22, the source region 24 and the gate structure 100.

According to the preferred embodiment of this invention, the transitional stress layer 40 has a pre-selected stress status, for example, tensile-stressed or compressive-stressed. Typically, in a case that the MOS transistor device is an NMOS device, the transitional stress layer 40 is tensile-stressed, while in a case that the MOS transistor device is a PMOS device, the transitional stress layer 40 is compressive-stressed. Afterward, a surface treatment, such as a UV curing process, a thermal spike anneal process or an e-beam treatment, can be performed to the transitional stress layer 40 so as to alter the stress value. Alternatively, the initial deposition stress of the transitional stress layer 40 may be adjusted to the desired value by altering process parameters for forming the transitional stress layer 40.

Figure 16:
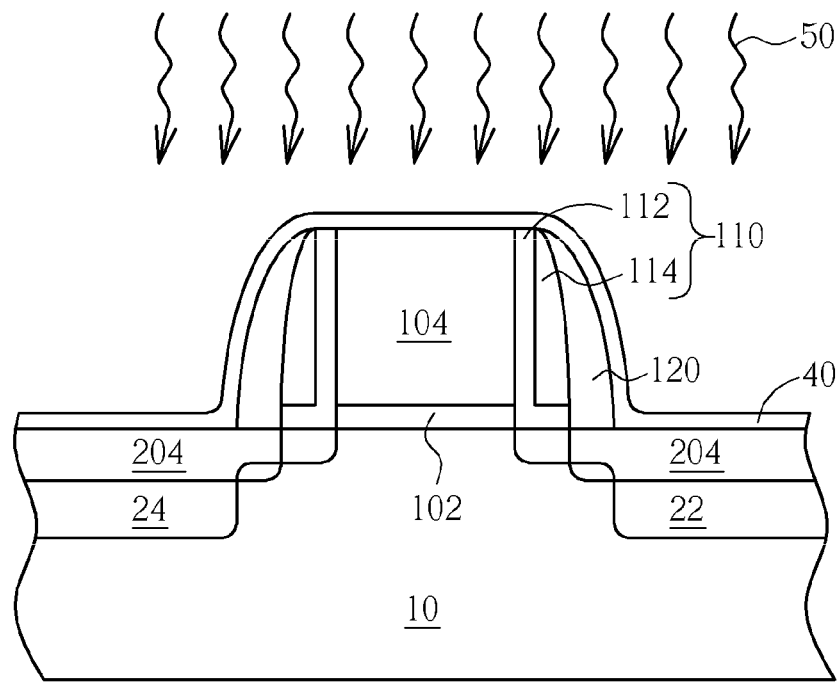

As shown in FIG. 16, after the deposition of the transitional stress layer 40, a laser anneal process 50 such as laser spike anneal (LSA) or laser thermal anneal (LTA) is then carried out. The laser anneal process 50 is accomplished by scanning laser beam with specific power and scanning speed across a wafer or a chip so that areas are locally heated, and thus annealed, as the laser beam passes. By implementing the laser anneal process 50, the semiconductor substrate 10 treated with PAI process can memorize the stress that the transitional tress layer 40 imparts thereto. According to the preferred embodiment of this invention, the laser anneal process 50 is carried out with a first temperature that ranges between 1100° C. and 1350° C., preferably 1300° C.

The aforesaid laser anneal process 50, which is also referred to as millisecond anneal technique, scans a narrow beam from a long-wavelength laser across the wafer surface to create a small, localized hot spot with a millisecond or shorter dwell time. Since only a thin layer at the top surface is heated and the bulk of the wafer remains cool, the surface temperature falls almost as fast as it rises. The high peak temperature produces high dopant activation, and the short dwell time leads to minimal dopant diffusion and lower thermal budget such that the ultra-shallow junction of the MOS device can be maintained, as required for the 65 nm technology node and beyond. The processed region can be localized to specific areas on the wafer without affecting surrounding areas.

Figure 17:
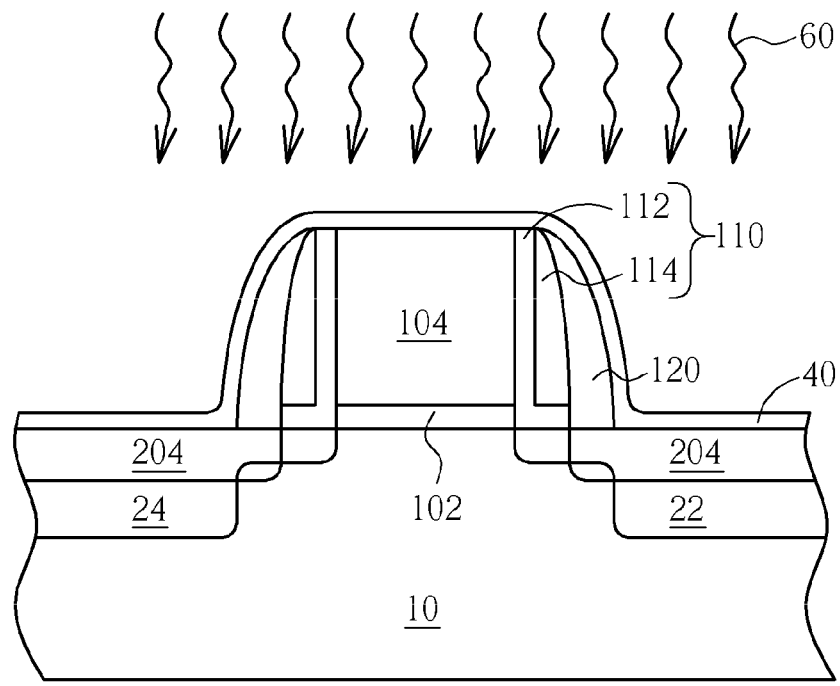

As shown in FIG. 17, after performing the laser anneal process 50, a rapid thermal process (RTP) 60 with a second temperature is subsequently carried out. The RTP 60 may be a spike RTP, for example. According to the preferred embodiment of this invention, the second temperature is greater than 1000° C. and is lower than the first temperature used in the laser anneal process 50. Preferably, the second temperature is about 1050° C. It is one main purpose of the RTP 60 to activate the dopants in the drain region 22 and the source region 24 and recrystallize the amorphized gate conductive layer 104 as well as the drain region 22 and source region 24. It is another main purpose of the RTP 60 to repair the silicon dislocation defects caused by the laser anneal process 50.

Figure 18:
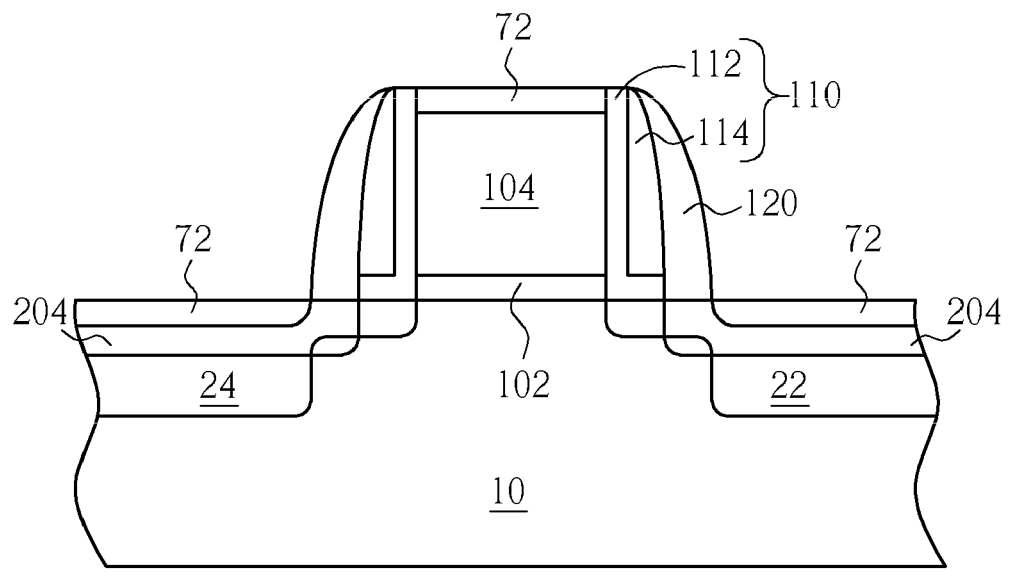

As shown in FIG. 18, after performing the RTP 60, the transitional stress layer 40 is completely removed. At this point, the semiconductor substrate 10 treated with laser anneal process 50 has memorized the stress originated from the transitional stress layer 40. Subsequently, a silicide or salicide process is performed to form silicide layers 72 such as nickel silicide or cobalt silicide on the drain region 22, the source region 24 and the gate structure 100. In one embodiment, the silicide layer 72 is not formed on the gate structure 100 because a cap layer (not shown) is provided on the gate conductor layer 104. It is noteworthy that the transitional stress layer 40 may be removed before the RTP 60 in other cases.

Figure 19:
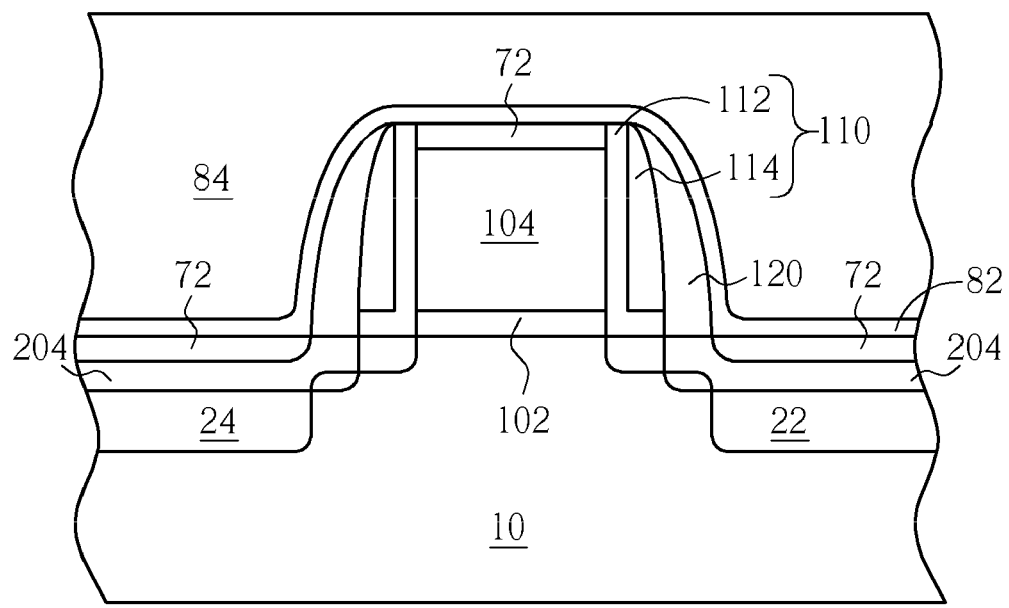

As shown in FIG. 19, after removing the transitional stress layer 40, a CVD process is carried out to deposit a conformal contact etch stop layer (CESL) 82 such as silicon nitride on the surface of the semiconductor substrate 10. The contact etch stop layer 82 may have a thickness ranging between 400 angstroms and 850 angstroms. The contact etch stop layer 82 covers the drain region 22, the source region 24 and the gate structure 100. According to the preferred embodiment, the contact etch stop layer 82 has a pre-selected stress status, for example, tensile-stressed or compressive-stressed. In a case that the MOS transistor device is an NMOS device, the contact etch stop layer 82 is tensile-stressed, while in a case that the MOS transistor device is an PMOS device, the contact etch stop layer 82 is compressive-stressed. Thereafter, a dielectric layer 84 is formed on the contact etch stop layer 82. The following metal interconnection process such as contact hole etching or copper damascene process are known in the art and are therefore not described herein.

Those skilled in the art will readily observe that numerous modifications and alterations of the device and method may be made while retaining the teachings of the invention.

What is claimed is:

1. A method for fabricating a semiconductor device, comprising:
   providing a semiconductor substrate;
   forming a gate structure on the semiconductor substrate;
   forming a source region and a drain region in the semiconductor substrate on two sides of the gate structure;
   performing a pre-amorphization ion implantation process to pre-amorphizing the source region and the drain region;
   forming a transitional stress layer on the semiconductor substrate to cover the gate structure, the source region and the drain region after performing the pre-amorphizing ion implantation process;
   subjecting the semiconductor substrate to a laser anneal process with a first temperature after forming the transitional stress layer;
   removing the transitional stress layer after the laser anneal process; and
   after removing the transitional stress layer, subjecting the semiconductor substrate to a rapid thermal process (RTP) with a second temperature, wherein the first temperature is greater than the second temperature.

2. The method of claim 1 wherein the first temperature ranges between 1100° C. and 1350° C.

3. The method of claim 2 wherein the first temperature is 1300° C.

4. The method of claim 1 wherein the laser anneal process comprises laser spike anneal (LSA) or laser thermal anneal (LTA).

5. The method of claim 1 wherein the gate structure comprises a gate dielectric layer on the semiconductor substrate and a gate conductive layer on the gate dielectric layer.

6. The method of claim 1 wherein the transitional stress layer comprises a silicon nitride layer.

7. The method of claim 1 wherein the RTP activates dopants in the drain region and the source region and also repairs silicon dislocation defects in the semiconductor substrate.

8. The method of claim 1 wherein the second temperature is greater than 1000° C.

9. The method of claim 8 wherein the second temperature is 1050° C.

10. The method of claim 1 wherein forming a source region and a drain region in the semiconductor substrate on two sides of the gate structure comprises the following steps:
    etching the semiconductor substrate to form recessed areas;
    performing a selective epitaxial growth (SEG) process to form epitaxial layer within the recessed areas; and
    performing an ion implantation process to form the source region and the drain region.

11. A method for fabricating a semiconductor device, comprising:
    providing a semiconductor substrate;
    forming a gate structure on the semiconductor substrate;
    forming a source region and a drain region in the semiconductor substrate on two sides of the gate structure;
    performing a pre-amorphization ion implantation process to pre-amorphizing the source region and the drain region;
    forming a transitional stress layer on the semiconductor substrate to cover the gate structure, the source region and the drain region after performing the pre-amorphizing ion implantation process;
    subjecting the semiconductor substrate to a laser anneal process with a first temperature after forming the transitional stress layer;
    subjecting the semiconductor substrate to a rapid thermal process (RTP) with a second temperature, wherein the first temperature is greater than the second temperature after the laser anneal process; and
    after the RTP process, removing the transitional stress layer.

12. The method of claim 11 wherein the first temperature ranges between 1100° C. and 1350° C.

13. The method of claim 11 wherein the first temperature is 1300° C.

14. The method of claim 11 wherein the laser anneal process comprises laser spike anneal (LSA) or laser thermal anneal (LTA).

15. The method of claim 11 wherein the gate structure comprises a gate dielectric layer on the semiconductor substrate and a gate conductive layer on the gate dielectric layer.

16. The method of claim 11 wherein the transitional stress layer comprises a silicon nitride layer.

17. The method of claim 11 wherein the RTP activates dopants in the drain region and the source region and also repairs silicon dislocation defects in the semiconductor substrate.

18. The method of claim 11 wherein the second temperature is greater than 1000° C.

19. The method of claim 18 wherein the second temperature is 1050° C.

20. The method of claim 11 wherein the RTP comprises spike RTP.

* * * * *